US011476120B2

(12) United States Patent
Muthur Srinath et al.

(10) Patent No.: US 11,476,120 B2
(45) Date of Patent: Oct. 18, 2022

(54) METHOD OF SAMPLE PREPARATION USING DUAL ION BEAM TRENCHING

(71) Applicant: Intel Corporation, Santa Clara, CA (US)

(72) Inventors: Purushotham Kaushik Muthur Srinath, Chandler, AZ (US); Richard Kenneth Brewer, San Tan Valley, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 407 days.

(21) Appl. No.: 16/481,056

(22) PCT Filed: Mar. 30, 2017

(86) PCT No.: PCT/US2017/025139
§ 371 (c)(1),
(2) Date: Jul. 25, 2019

(87) PCT Pub. No.: WO2018/182640
PCT Pub. Date: Oct. 4, 2018

(65) Prior Publication Data
US 2020/0098554 A1 Mar. 26, 2020

(51) Int. Cl.
*H01L 21/027* (2006.01)
*H01J 37/31* (2006.01)
(Continued)

(52) U.S. Cl.
CPC ............ *H01L 21/027* (2013.01); *H01J 37/31* (2013.01); *H01L 21/265* (2013.01); *H01J 37/30* (2013.01);
(Continued)

(58) Field of Classification Search
None
See application file for complete search history.

(56) References Cited

U.S. PATENT DOCUMENTS 6,211,527 B1 * 4/2001 Chandler .......... H01L 21/31116
250/492.2
6,331,381 B1 * 12/2001 Chaudhari .......... G02F 1/13378
349/124
(Continued)

FOREIGN PATENT DOCUMENTS

JP 5046648 10/2012

OTHER PUBLICATIONS

International Preliminary Report on Patentability for International Patent Application No. PCT/US2017/025139, dated Oct. 10, 2019, 6 pages.
(Continued)

*Primary Examiner* — Jason Berman
(74) *Attorney, Agent, or Firm* — Schwabe, Williamson & Wyatt, P.C.

(57) ABSTRACT

Systems and methods of sample preparation using dual ion beam trenching are described. In an example, an inside of a semiconductor package is non-destructively imaged to determine a region of interest (ROI). A mask is positioned over the semiconductor package, and a mask window is aligned with the ROI. A first ion beam and a second ion beam are swept, simultaneously or sequentially, along an edge of the mask window to trench the semiconductor package and to expose the ROI for analysis.

9 Claims, 9 Drawing Sheets

(51) Int. Cl.
*H01L 21/265* (2006.01)
*H01J 37/30* (2006.01)

(52) U.S. Cl.
CPC ............... *H01J 2237/31745* (2013.01); *H01J 2237/31749* (2013.01); *H01J 2237/31774* (2013.01)

(56) References Cited

U.S. PATENT DOCUMENTS

| | | |
|---|---|---|
| 7,427,753 B2 | 9/2008 | Pearl |
| 7,611,610 B2 | 11/2009 | Nadeau et al. |
| 7,842,920 B2 | 11/2010 | Lundquist |
| 2008/0073586 A1* | 3/2008 | Iwasaki ............... H01J 37/3056 250/492.21 |
| 2008/0224198 A1* | 9/2008 | Fujii ................... H01J 37/3056 257/307 |
| 2009/0218488 A1 | 9/2009 | Wells |
| 2016/0181058 A1* | 6/2016 | Biberger ............... H01J 37/304 250/396 R |
| 2017/0011885 A1 | 1/2017 | Lechner |

OTHER PUBLICATIONS

International Search Report and Written Opinion for International Patent Application No. PCT/US2017/025139 dated Nov. 27, 2017, 7 pgs.

\* cited by examiner

METHOD OF SAMPLE PREPARATION USING DUAL ION BEAM TRENCHING

CROSS-REFERENCE TO RELATED APPLICATION

This patent application is a U.S. National Phase Application under 35 U.S.C. § 371 of International Application No. PCT/US2017/025139, filed Mar. 30, 2017, entitled "METHOD OF SAMPLE PREPARATION USING DUAL ION BEAM TRENCHING," which designates the United States of America, the entire disclosure of which is hereby incorporated by reference in its entirety and for all purposes.

FIELD OF THE INVENTION

Embodiments are in the field of integrated circuit packages and, in particular, systems and methods for exposing buried features in assembled semiconductor packages.

BACKGROUND OF THE INVENTION

Assembled semiconductor packages may experience failures in a substrate, an active silicon, or an electrical interconnect. To analyze and determine a root cause of such failures, various tools are available. For example, non-destructive imaging of the semiconductor package may be performed using a scanning acoustic microscope to perform scanning acoustic tomography and detect instances of voids, cracks, or delamination in the semiconductor package. Images generated by such non-destructive methods can identify a location of a failure, but do not necessarily provide precise imagery of a region of interest at the location. Additional information can be obtained by destructive cross-sectioning the semiconductor package to expose the region of interest. Classical cross-sectioning techniques include grinding and polishing a sample to expose a buried feature for failure analysis. Recently, focused ion beam (FIB) systems or broad ion beam (BIB) milling systems have been used individually to cross-section semiconductor packages in preparation for failure analysis. Once the region of interest has been analyzed to determine the root cause of the failure, appropriate solutions, e.g., design, material, or process changes, can be devised.

DETAILED DESCRIPTION OF THE INVENTION

Systems and methods of sample preparation using dual ion beam trenching are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing techniques of preparing semiconductor packages for failure analysis suffer from poor surface results or slow throughput. For example, classical cross-sectioning techniques can introduce gross defects into a targeted region of interest. Such artifacts can mask a defect, e.g., a void or microcrack. Artifacts can compromise or prevent an accurate determination of a root cause of a failure. Focused ion beam (FIB) and broad ion beam (BIB) milling systems may be used to obtain artifact-free cross-sectional exposure of assembled semiconductor packages. These systems, however, have low throughput. For example, FIB milling systems can expose a limited area of interest to a depth of only several thousands of microns (or less) because the systems remove material at nanometer resolutions. Despite being impractical for larger exposure areas or deeper cuts, from both a technical and throughput perspective, FIB milling systems cost upward of a million dollars in capital expenditure and several thousand dollars per year in maintenance costs. Although less expensive than FIB milling systems, BIB milling systems are incapable of deep trenching because they are effectively a surface cleaning tool that requires initial exposure of a region of interest to within several microns of a sample surface. The initial exposure is usually performed by mechanical trenching that, as noted above, can generate artifacts that compromise the failure analysis.

In an aspect, a sample preparation system, and a method of sample preparation, includes dual ion beams to expose a large cross-sectional area of a semiconductor package and to analyze deeply buried features of the semiconductor package along a cross-sectional plane. The dual beam ion trenching can be performed by a first, high current density, ion beam to trench to a location within the sample, and a second, low current density, ion beam to expose a region of interest at the location for further analysis. The region of interest can be targeted using in situ non-destructive imaging, and the sample material can be removed to expose the region of interest using a mask having a window of a predetermined geometry. The mask window can be aligned with the region of interest in real time. Accordingly, artifact-free exposure of buried features of semiconductor packages can be performed with faster throughput and lower costs than currently available cross-sectioning techniques.

Figure 1:
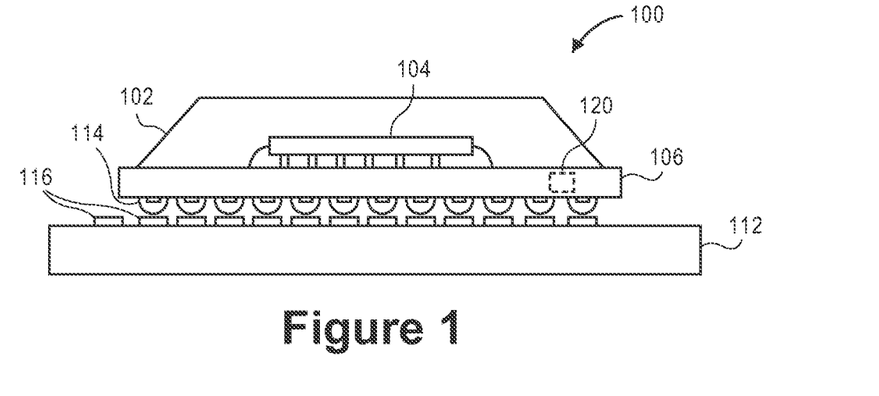
FIG. 1 illustrates a sectional view of a semiconductor package assembly, in accordance with an embodiment.

Referring to FIG. 1, a sectional view of a semiconductor package assembly is illustrated in accordance with an embodiment. A semiconductor package assembly 100 may include one or more semiconductor packages 102 having integrated dies in communication with each other or other components of the assembly. In an embodiment, semiconductor package 102 is a system having a semiconductor die 104, e.g., a memory die, mounted on a package substrate 106. Semiconductor die 104 may be connected to other dies and to conductive components of package substrate 106 by electrical interconnects. The electrical interconnects may be, for example, wire bonds or electrical bump interconnects. The electrical interconnects may include vias and traces within package substrate 106, as described below.

In an embodiment, package substrate 106 may be mounted on a circuit board 112. For example, semiconductor package 102 of semiconductor package assembly 100 may be a ball grid array (BGA) component having several solder balls 114 arranged in a ball field. That is, an array of solder balls 114 may be arranged in a grid or other pattern. Each solder ball 114 may be mounted and attached to a corresponding contact pad 116 of circuit board 112. Solder balls 114 and contact pads 116 may be electrically connected by electrical interconnects extending over or through circuit board 112, as is known in the art. Circuit board 112 may be a motherboard or another printed circuit board of a computer system or device. Circuit board 112 may include signal routing to external device connectors (not shown). Accordingly, the solder ball and contact pad attachments may provide a physical and electrical interface between the die 104 of semiconductor package 102 and an external device.

In an embodiment, semiconductor package assembly 100 may have a region of interest (ROI) 120. ROI 120 may be a defect, e.g., a void or microcrack, in die 104, package substrate 106, or circuit board 112. More particularly, ROI 120 may be a location of a failure of one or more components of semiconductor package assembly 100. ROI 120 may be inside the failed component. That is, ROI 120 may be a buried feature. To determine a solution to the failure, it may be necessary to evaluate ROI 120 to assess a root cause and potential fixes, e.g., design, material, or process changes to improve future builds of semiconductor package assembly 100. It will be appreciated that, although the description below focuses on preparing a sample of semiconductor package 102 for failure analysis, the systems and methods may be used to prepare samples of circuit board 112 or an external device for failure analysis.

Figure 2A:
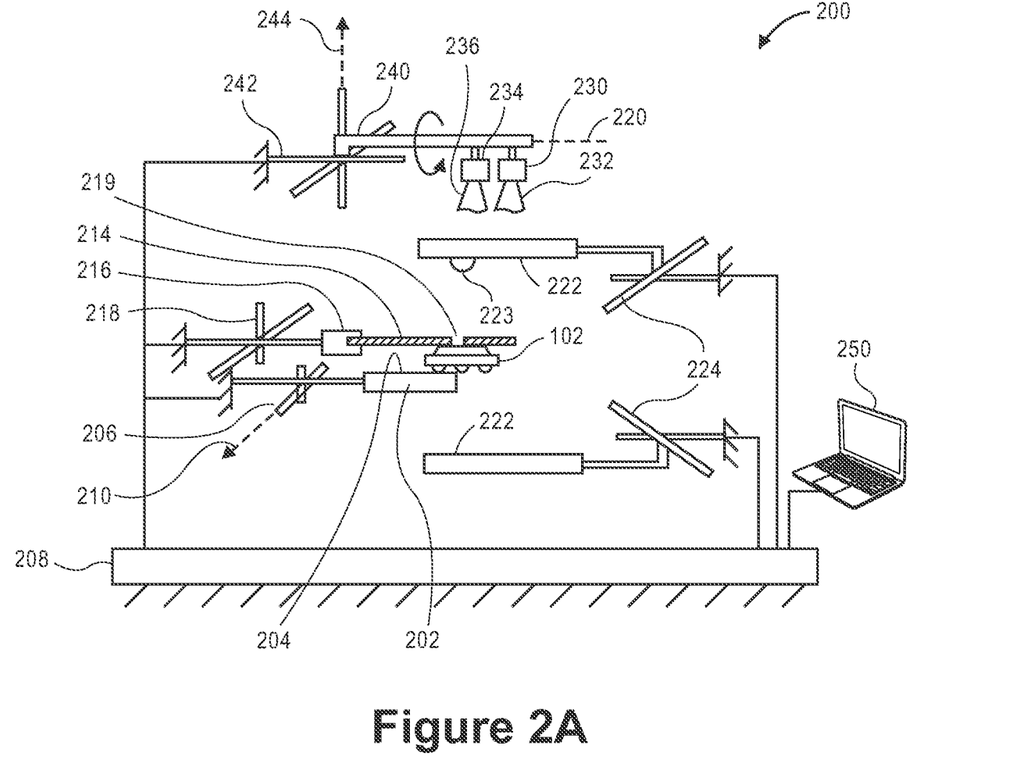
FIGS. 2A-2B illustrate schematic views of a sample preparation system, in accordance with an embodiment.

Referring to FIG. 2A, a schematic view of a sample preparation system is shown in accordance with an embodiment. Sample preparation system 200 may include a subsystem for holding semiconductor package 102, a subsystem for positioning a mask over semiconductor package 102, a subsystem for nondestructively imaging semiconductor package 102, and a subsystem for trenching semiconductor package 102 to expose ROI 120 for failure analysis.

The subsystem for holding semiconductor package 102 may include a sample stage 202 having a support surface 204 to hold semiconductor package 102. Support surface 204 may be a surface of a platform. For example, the platform may be a clamping surface of an electrostatic chuck used to grip an external surface of semiconductor package 102. Alternatively, support surface 204 may be a surface of a jaw of a mechanical vise, by way of example. Support surface 204 may fix semiconductor package 102 to sample stage 202, and thus, a position of semiconductor package 102 within a frame of reference of sample preparation system 200 may be known.

Sample stage 202 may be movable within the frame of reference. For example, sample stage 202 may be mounted on a stage actuator 206 that can move sample stage 202 relative to a chassis 208 of sample preparation system 200. Stage actuator 206 may be an x-y stage having at least two degrees of freedom, e.g., along orthogonal axes within a horizontal plane. For example, stage actuator 206 may move sample stage 202 along a horizontal axis 210 in a first horizontal direction, and in a second horizontal direction orthogonal to horizontal axis 210. The x-y stage may be driven by electrical or pneumatic actuators.

The subsystem for positioning a mask over semiconductor package 102 may include a mask holder 216 to hold a mask 214. Mask holder 216 may be a clamp, e.g., a chuck or vise, or another fastening device having a gripping surface that engages mask 214. Mask 214 may be fixed to mask holder 216, at least temporarily, and thus a position of mask 214 within the frame of reference of sample preparation system 200 may be known.

Mask holder 216 may be movable within the frame of reference of sample preparation system 200. For example, a mask actuator 218 may be operably coupled to mask holder 216 to move mask 214 within the frame of reference. In an embodiment, mask holder 216 may be mounted on mask actuator 218 that can move mask holder 216 relative to chassis 208 of sample preparation system 200. Mask actuator 218 may be an x-y stage having at least two degrees of freedom, e.g., in the first horizontal direction or in the second horizontal direction parallel to axis 220 and orthogonal to horizontal axis 210. The x-y stage may be driven by electrical or pneumatic actuators. Mask actuator 218 may be controlled to position mask 214 over semiconductor package 102. More particularly, mask holder 216 may position mask 214 between semiconductor package 102 and the subsystem for trenching semiconductor package 102, as described below.

Mask 214 may have a mask window 219. Mask window 219 may be an opening in mask 214 to allow an ion beam to pass from an upper side of mask 214 to a lower side of mask 214. More particularly, one or more window edges may extend around the opening to define mask window 219 in mask 214. Mask holder 216 may move mask 214 to align a window edge with ROI 120 in semiconductor package 102, as described below.

Mask 214 may be a hard mask fabricated from a material that is resistant to ion ablation. For example, mask 214 may include one or more of tungsten carbide or titanium. Accordingly, an ion beam directed toward mask 214 may only pass through mask window 219. Mask window 219 may have a predetermined geometry. For example, the window edges may be connected in a closed figure, e.g., a rectangle, to permit a broad ion beam to project through mask 214 toward an underlying semiconductor package 102. The broad ion beam that passes through the highly precision cut hard mask 214 can ablate a shape within a footprint of semiconductor package 102 that matches the predetermined geometry of mask window 219. That is, mask 214 may shade regions of semiconductor package 102 from an impinging ion beam, and the ion beam may ablate a region of semiconductor package 102 within the shaded regions and below mask window 219.

The system for nondestructively imaging semiconductor package 102 may be an imaging system 222 used to image an inside of semiconductor package 102. Imaging system 222 may be a two-dimensional imaging system 222 having a source for electromagnetic radiation or light, and/or a camera, directed toward sample stage 202. For example, imaging system 222 may be radiographic equipment, e.g., an x-ray imaging system 222, having an x-ray source and an x-ray detector to view an internal structure of semiconductor package 102. Accordingly, the inside of semiconductor package 102 may be imaged to determine a location of ROI 120. ROI 120 may be situated along a vertical plane orthogonal to the horizontal planes containing horizontal axis 210 and axis 220.

Imaging system 222 may include other imaging modalities. For example, imaging system 222 may be an infrared imaging system or an ultrasound imaging system, to name only a few alternatives. In any case, imaging system 222 may be capable of imaging buried features in semiconductor package 102 without damaging semiconductor package 102. Such imaging may be performed in-situ, and thus, a location and/or orientation of ROI 120 can be determined prior to trenching semiconductor package 102.

A camera 223 of imaging system 222 may be movable within the frame of reference. For example, camera 223 may be mounted on an imaging system actuator 224 of imaging system 222 that can move camera 223 relative to chassis 208 of sample preparation system 200. Imaging system actuator 224 may be an x-y stage having at least two degrees of freedom, e.g., along axes parallel to horizontal axis 210 or axis 220. The x-y stage may be driven by electrical or pneumatic actuators. Imaging system actuator 224 may be controlled to position camera 223 of imaging system 222 vertically in line with imaging system 222. Camera 223 can be retracted back to provide a clear path for ion beams 232, 236 after the mask alignment process is complete.

The subsystem for trenching semiconductor package 102 may include a dual ion beam apparatus. More particularly, sample preparation system 200 may include a first ion gun 230 mounted above sample stage 202 to project a first ion beam 232 toward semiconductor package 102. Sample preparation system 200 may also include a second ion gun 234 mounted above sample stage 202 to project a second ion beam 236 toward semiconductor package 102. First ion gun 230 and second ion gun 234 may project ion beams having respective current densities. For example, first ion beam 232 emitted by first ion gun 230 may have a first current density, and second ion beam 236 emitted by second ion gun 234 may have a second current density different than the first current density. First ion beam 232 may be configured to trench deeply into semiconductor package 102 for coarse material removal, and second ion beam 236 may be configured for artifact-free cleanup of a surface cut by first ion beam 232. Accordingly, the second current density of second ion beam 236 may be less than the first current density of first ion beam 232.

First ion beam 232 and second ion beam 236 may differ in manners other than (or in addition to) the aforementioned differences in beam current densities. In an embodiment, first ion beam 232 includes a first ion species different than a second ion species of second ion beam 236. For example, first ion gun 230 may emit first ion beam 232 having a higher mass ion species than a mass ion species of second ion beam 236. By way of example, first ion beam 232 may include a gallium ion species and second ion beam 236 may include an argon ion species. The beam having a higher mass ion species may be used for rough trenching of semiconductor package 102, and the beam having a lower mass ion species may be used for final cleaning of an ROI 120 of the trenched substrate, as described below.

First ion beam 232 and second ion beam 236 may be accelerated ion beams having energies on a kiloelectronvolt (keV) scale. The current densities of the ion beams correspond to the beam energy levels and determine how quickly the beams can ablate material away from semiconductor package 102. The current densities may range from several nanoamperes to several milliamperes, by way of example. The first current density of first ion beam 232 may be at least several times higher than the second current density of second ion beam 236. For example, the first ion beam 232 may have a beam energy in a range of 12-15 keV, and the second ion beam 236 may have a beam energy in a range of 4-8 keV. In an embodiment, the first current density is at least an order of magnitude greater than the second current density of second ion beam 236. First ion beam 232 may react more with the surface of semiconductor package 102 and create more artifacts than second ion beam 236. Accordingly, first ion gun 230 and second ion gun 234 may be independently movable to sweep the ion beams across the surface of semiconductor package 102 either simultaneously or sequentially in order to perform trench mill cutting anywhere in the sample.

In an embodiment, sample preparation system 200 includes one or more rastering stage 240, and each rastering stage 240 can support one or more ion guns. For example, first ion gun 230 and second ion gun 234 may be mounted on rastering stage 240, or first ion gun 230 may be mounted on a first rastering stage and second ion gun 234 may be mounted on a second rastering stage. Rastering stage(s) 240 may be movable within the frame of reference of sample preparation system 200. For example, rastering stage 240 may be mounted on a ion gun actuator 242 that can move rastering stage 240 relative to chassis 208 of sample preparation system 200. Ion gun actuator 242 may be an x-y stage having at least two degrees of freedom, e.g., along axes parallel to horizontal axis 210 and axis 220. Ion gun actuator 242 may also move in a vertical direction, e.g., along a vertical axis 244 to change a distance between the ion gun(s) and semiconductor package 102. It will be appreciated that similar vertical movements may be affected by stage actuator 206, mask actuator 218, or imaging system actuator 224 for various purposes, such as adjusting a focus of imaging system 222 on the targeted ROI 120. The x-y stage and/or vertical actuator of ion gun actuator 242 may be driven by electrical or pneumatic actuators.

Rastering stage 240 may also be rotatable about a horizontally extending axis 220. That is, rastering stage 240 may rotate about axis 220. Axis 220 may be orthogonal to vertical axis 244, and accordingly, orthogonal to a vertical plane within semiconductor package 102 along which ROI 120 is located. Thus, as described below, rotation of rastering stage 240 about axis 220 can cause one or more of first ion gun 230 or second ion gun 234 to rotate about axis 220 orthogonal to the vertical plane. Such rotation can cause first ion beam 232 or second ion beam 236 to sweep across mask window 219. As the beam(s) sweep along a window edge of mask window 219, the predetermined geometry of mask window 219 may be projected onto semiconductor package 102, and material may be removed from semiconductor package 102 in a matching profile.

The trenching subsystem having dual ion guns 230, 234 may be on a different side of semiconductor package 102 as imaging system 222, e.g., one subsystem may be over semiconductor package 102 and the other subsystem may be under semiconductor package 102 (FIG. 2A). Alternatively, the subsystems may both be on a same side of semiconductor package 102, e.g., both over semiconductor package 102. When both subsystems are on a same side of semiconductor package 102, the subsystems may be moved relative to each other to avoid interfering with the respective imaging or trenching functions. For example, imaging system 222 can be moved laterally out of a beam path of dual ion guns 230, 234 during the trenching process.

Operation of sample preparation system 200 may be controlled at least in part by a computer system 250. In an embodiment, computer system 250 may control the operation of sample preparation system 200 based on feedback signals received from various sensors associated with the actuator subsystems described above. For example, the actuator subsystems may be under servo control. Accordingly, computer system 250 may monitor relative positions between the components of sample preparation system 200 within the frame of reference and adjust the relative positions and/or orientations to control a method of sample preparation using dual ion beam trenching, as described in further detail below.

Figure 2B:
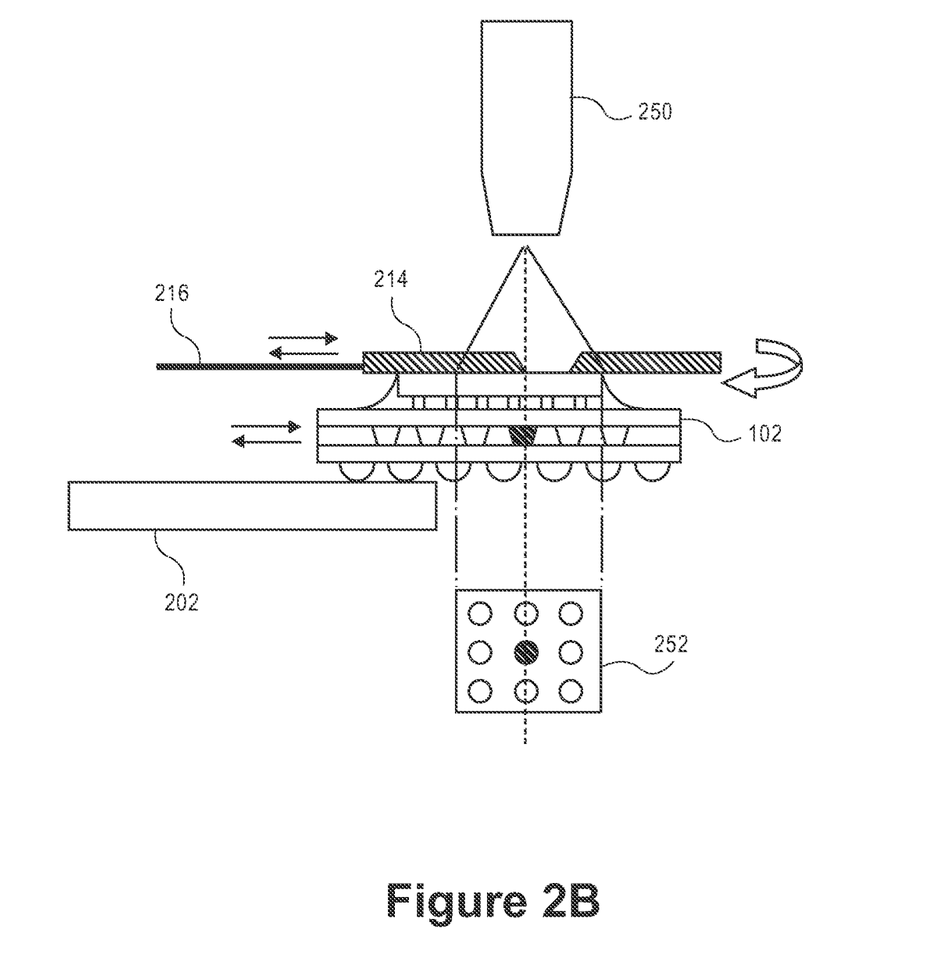

Referring to FIG. 2B, a schematic view of a sample preparation system is shown in accordance with an embodiment. In an embodiment, the portion of sample preparation system 200 including imaging system 222 can be located separately from the portion of sample preparation system 200 having dual ion guns 230, 234. That is, whereas all subsystems of sample preparation system 200 are shown as being collocated in FIG. 2A, at least one subsystem of sample preparation system 200 may be independently stationed as shown in FIG. 2B. Accordingly, the structure of sample preparation system 200 schematically illustrated in FIGS. 2A-2B is illustrative and not restrictive of other machine configurations that would be within the skill in the art.

An x-ray-based or infrared-based alignment of mask 214 to ROI 120 may be performed in an independent system, i.e., a separately located subsystem of sample preparation system 200. Imaging system 222 may include an x-ray source 250 on a first side of mask 214 and semiconductor package 102, and an x-ray detector 252 on a second side of mask 214 and semiconductor package 102. Movement of mask 214 may be effected by moving mask holder 216 via mask actuator 218, and movement of semiconductor package 102 may be effected by moving sample stage 202 via stage actuator 206. Accordingly, semiconductor package 102 can be located between x-ray source 250 and x-ray detector 252 to allow an image of ROI 120 within semiconductor package 102 to be captured. Mask 214 can be moved over (and in contact with) semiconductor package 102 to align a mask edge with ROI 120 based on the captured image.

Figure 3:
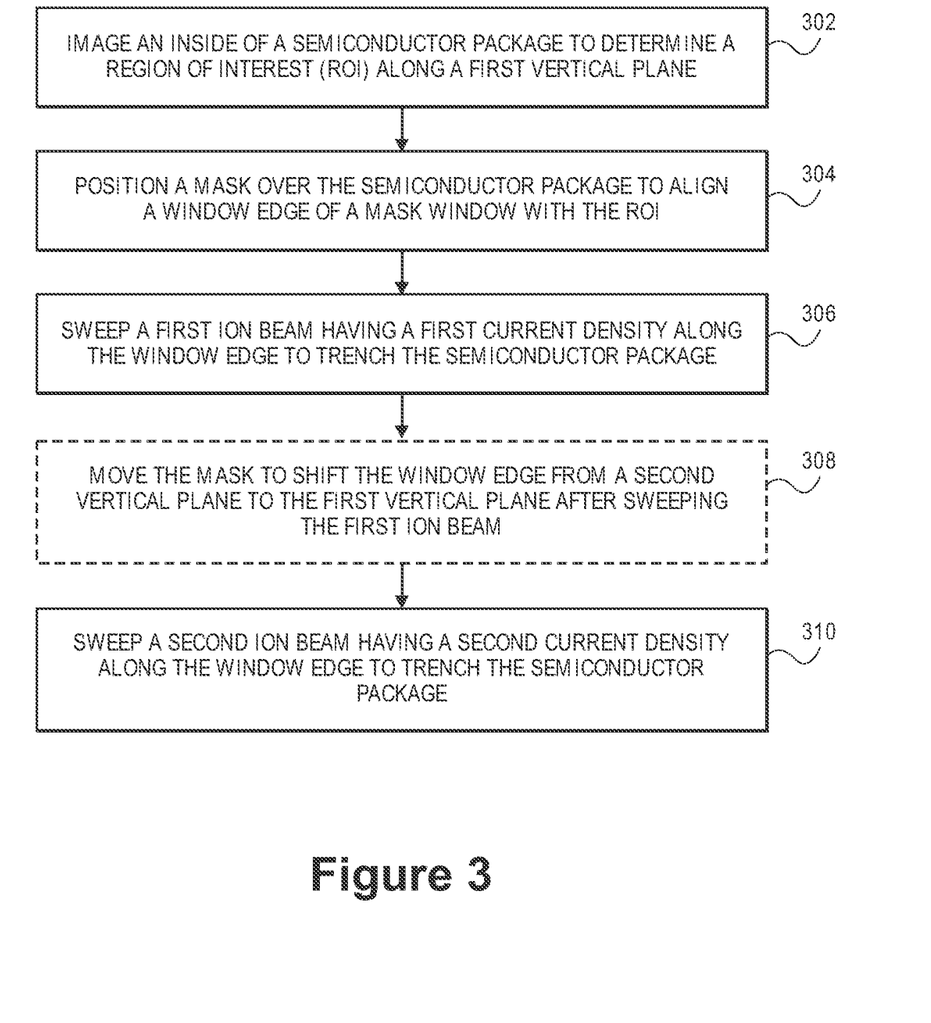
FIG. 3 illustrates a method of sample preparation using dual ion beam trenching, in accordance with an embodiment.

Referring to FIG. 3, a method of sample preparation using dual ion beam trenching is shown in accordance with an embodiment. FIGS. 4A-4H show operations in the method of FIG. 3. Accordingly, FIGS. 3-4H are described in combination below.

A sample, e.g., semiconductor package 102 having a known failure, may be mounted on sample stage 202 below imaging system 222 and/or guns 230, 234. At operation 302, an inside of semiconductor package 102 may be imaged to determine ROI 120.

Figure 4A:
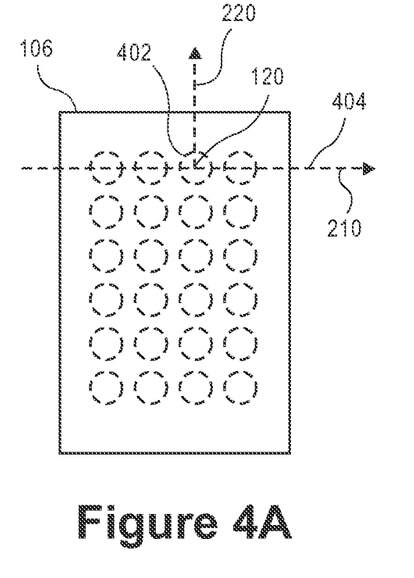
FIGS. 4A-4H illustrate operations in a method of sample preparation using dual ion beam trenching, in accordance with an embodiment.

Referring to FIG. 4A, ROI 120 may be the location within semiconductor package 102 where a root cause of the failure exists. For example, ROI 120 may be the location of a void or a microcrack within die 104 or package substrate 106. The defect may be located within a via 402 of die 104 or package substrate 106. Accordingly, ROI 120 may be located along a first vertical plane 404 passing through via 402. The vertical plane may extend in the vertical direction, i.e., parallel to vertical axis 244, and may be orthogonal to a horizontally oriented axis 220. By way of example, the vertical plane may contain horizontal axis 210 and vertical axis 244, and axis 220 may extend orthogonal to the vertical plane.

Figure 4B:
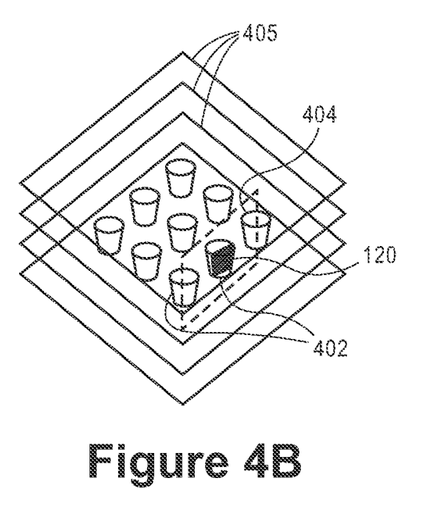

Referring to FIG. 4B, ROI 120 may extend along first vertical plane 404 within via 402. Accordingly, ROI 120 may be a buried region within semiconductor package 102. Imaging of ROI 120 may be performed by imaging system 222 by capturing through thickness structural details of semiconductor package 102 as in the case of a transmission x-ray imaging or by using a multitude of other techniques such as confocal or tomographic imaging to independently image each layer 405. Via 402 may be buried within the package substrate 106, and accordingly, imaging system 222 may identify ROI 120 as the buried region that can be exposed by cross-sectioning to visually analyze the defect within via 402.

Figure 4C:
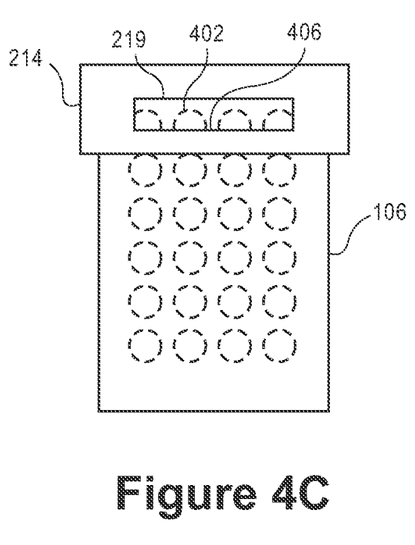

At operation 304, mask 214 may be positioned over semiconductor package 102. Referring to FIG. 4C, in an embodiment, a mask window 219 of mask 214 is aligned to via 402 of interest. More particularly, a window edge 406 that defines, in part, mask window 219 may be aligned with ROI 120 within first vertical plane 404. Window edge 406 may be a straight edge, e.g., one of four sides of a rectangular mask window 219. Mask window 219, however, may have any predetermined geometry. For example, mask window 219 may be elliptical, polygonal, or any other closed shape or closed figure. Thus, window edge 406 may be a straight or curvilinear segment of the contour surrounding the opening of mask window 219.

Figure 4D:
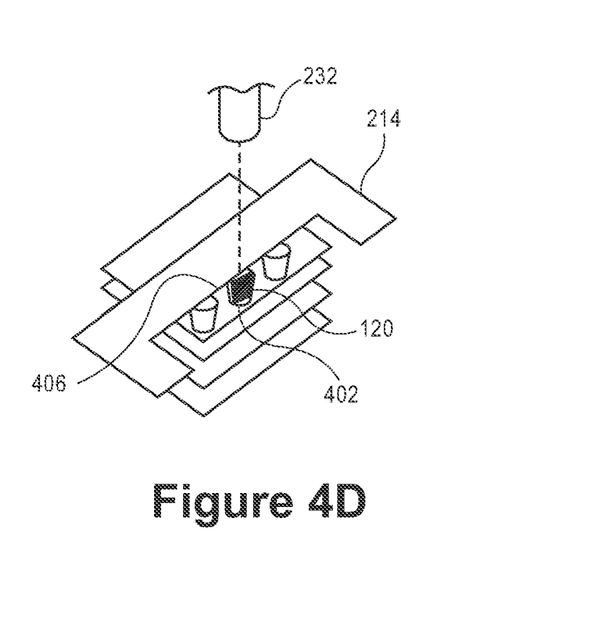

In an embodiment, mask 214 does not include a window shape, i.e., a closed shape, but instead has a mask edge that can be precisely aligned to ROI 120. The mask window 219 may therefore be an open edge of mask 214 without a window in the mask. For example, the mask edge may have a shape similar to the shown in FIG. 4D for window edge 406 (although window edge 406 in FIG. 4D is a partial view of a closed shape window). More particularly, mask 214 may be a straight edge, a curvilinear edge, a stepped edge, or any other edge on an outer profile of mask 214, i.e., not within a closed shape window formed in an interior portion of a body of mask 214. The mask edge can be aligned to ROI 120 and vertical planes 404, 412.

Referring to FIG. 4D, window edge 406 may be aligned with ROI 120 in situ. Alignment may be performed using nondestructive imaging data from imaging system 222. For example, x-ray or infrared imagery of the defect in via 402 may be captured to determine the location of the defect within the frame of reference of sample preparation system 200, and computer system 250 may control mask actuator 218 to move mask 214 to a position within the frame of reference such that window edge 406 is directly above ROI 120. Mask actuator 218 may be moved, i.e., in a horizontal direction, vertical direction, or tilted, to align window edge 406 with ROI 120 within vertical plane 404 passing through ROI 120. Window edge 406 may be located between ROI 120 and one or more of first ion gun 230 or second ion gun 234.

Alignment of window edge 406 over semiconductor package 102 may also be performed using optical alignment. For example, when semiconductor package 102 includes externally visible features, such as datum marks on an outer surface, mask 214 may be moved to align window edge 406 to the externally visible features. The externally visible features may be identified by an optical camera system.

Figure 4E:
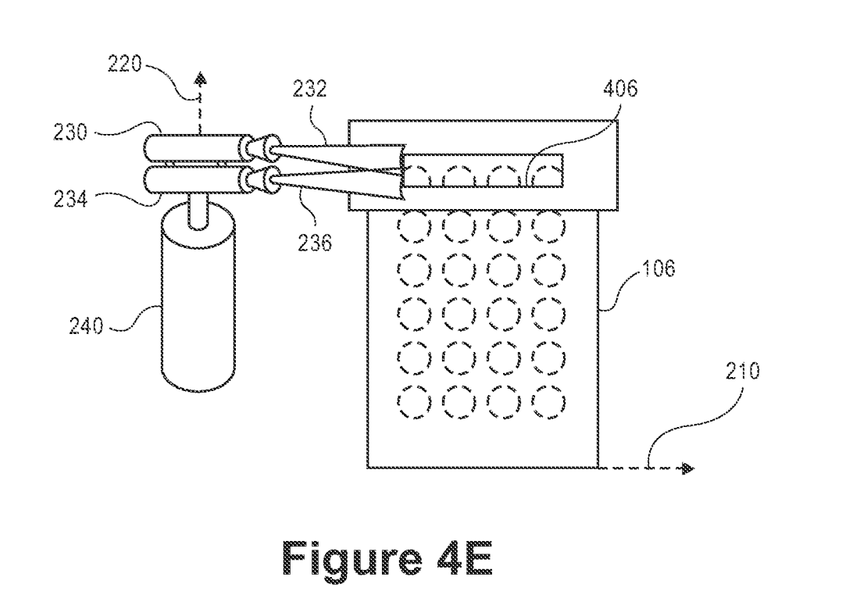

At operation 306, first ion beam 232 may be swept along window edge 406 to trench semiconductor package 102. Referring to FIG. 4E, first ion beam 232 may be projected toward mask window 219 by first ion gun 230. First ion gun 230 mounted on rastering stage 240 may be rotated about axis 220 that extends parallel to an upper surface of package substrate 106. More particularly, first ion gun 230 may be rotated about axis 220 orthogonal to first vertical plane 404 to sweep first ion beam 232 along window edge 406 of mask window 219. Accordingly, first ion beam 232 having a first current density can be projected orthogonal to axis 220 and directed toward window edge 406. As rastering stage 240 rotates first ion gun 230, first ion beam 232 may traverse a path on package substrate 106 parallel to window edge 406 of mask 214. Rastering first ion beam 232 can move first ion beam 232 in a direction orthogonal to axis 220, e.g., along the horizontal axis 210.

Figure 4F:
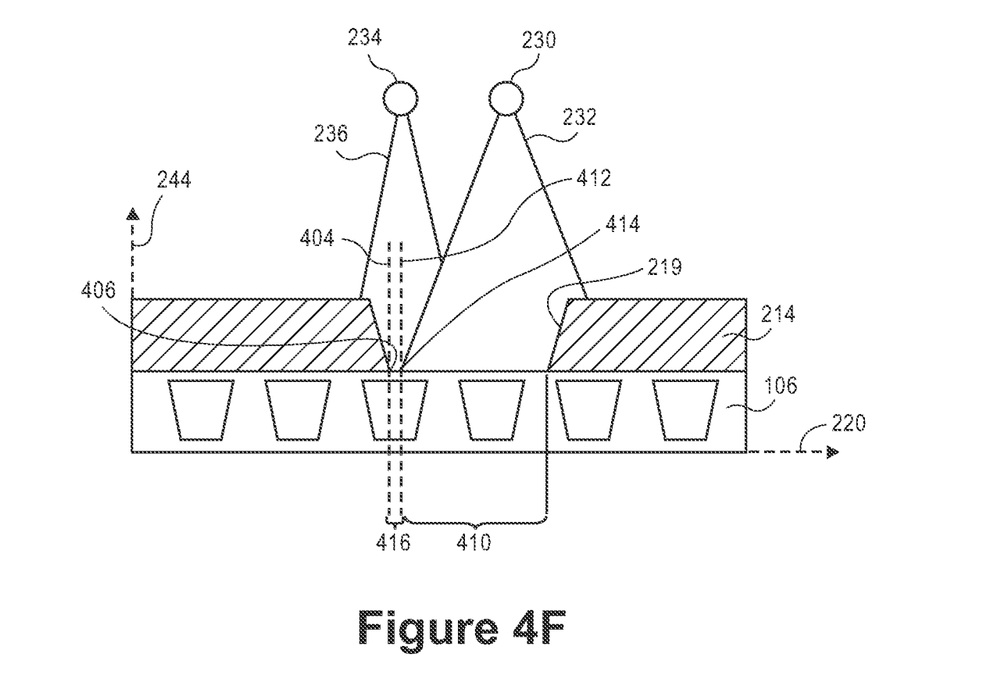

Referring to FIG. 4F, first ion beam 232 may impinge on a sample area of package substrate 106 exposed through mask window 219 of mask 214. First ion beam 232 may be an accelerated ion beam having the first current density. The first current density can be in a range, by way of example, greater than 10 keV. First ion beam 232 may sputter the exposed material in the sample area. More particularly, first ion beam 232 may remove material within a first portion 410 of semiconductor package 102.

In an embodiment, removal of first portion 410 of semiconductor package 102 may expose the inside of semiconductor package 102 along a second vertical plane 412. Second vertical plane 412 may be laterally offset from first vertical plane 404. More particularly, first ion beam 232 may be a non-focused beam having a beam edge 414 spaced apart from ROI 120 by a gap. The gap may be measured in a direction of axis 220. Beam edge 414 may trace along second vertical plane 412 as first ion beam 232 is swept over first portion 410. That is, beam edge 414 may be at second vertical plane 412 to remove material from semiconductor package 102 to form a trench. The trench may have a trench wall extending vertically along second vertical plane 412.

First ion beam 232 may be aligned with mask window 219 in a manner such that the ion beam impinges to a lesser degree on second portion 416 than on first portion 410. That is, first ion beam 232 may impinge at least partly on second portion 416 between window edge 406 and vertical plane 412, but the portion of first ion beam 232 within second portion 416 may have a lower beam density than the portion of first ion beam 232 within first portion 410. In an embodiment, first ion beam 232 has a Gaussian profile of beam density that tapers off toward the outward edges of the beam. Accordingly, beam edge 414 may have a lowest beam density of the profile. First ion beam 232 may be aligned with mask window 219 to ensure that the lower density region of the Gaussian profile is within second region 416, if at all.

By way of example, the gap between first vertical plane 404 and second vertical plane 412 may be a distance in a range of 10-200 microns, e.g., 100 microns. The distance, which can be controlled by spacing beam edge 414 apart from first vertical plane 404, may vary based on a degree of artifacts that are generated along the trench wall by first ion beam 232. For example, when first ion beam 232 has a higher current density, more artifacts may result. In such cases, first ion beam 232 may be located such that the gap between beam edge 414 and first vertical plane 404 is greater. That is, the gap distance may correspond directly to the current density of first ion beam 232. As a result, artifacts in the trench wall may be laterally separated from first vertical plane 404 and ROI 120 of semiconductor package 102 along first vertical plane 404.

A description of optional operation 308 is provided below. Turning now to operation 310 of FIG. 3, however, second ion beam 236 may be swept along window edge 406 to trench semiconductor package 102. Referring to FIG. 4E, second ion beam 236 may be projected toward mask window 219 by second ion gun 234. For example, second ion gun 234 mounted on rastering stage 240 may be rotated about axis 220 that extends parallel to an upper surface of package substrate 106. More particularly, second ion gun 234 may be rotated about an axis 220 orthogonal to first vertical plane 404 to sweep second ion beam 236 along window edge 406 of mask window 219. Accordingly, second ion beam 236 having a second current density can be projected orthogonal to axis 220 and directed toward window edge 406. As rastering stage 240 rotates second ion gun 234, second ion beam 236 may traverse a path on package substrate 106 parallel to window edge 406 of mask 214. Rastering second ion beam 236 can move second ion beam 236 in a direction orthogonal to axis 220, e.g., along the horizontal axis 210

Referring to FIG. 4F, second ion beam 236 emitted by second ion gun 234 may impinge on a sample area of package substrate 106 exposed through mask window 219 of mask 214. Second ion beam 236 may be an accelerated ion beam having the second current density in a range, by way of example, less than 10 keV. Thus, the second current density of second ion beam 236 may be less than the first current density of first ion beam 232. Second ion beam 236 may sputter the exposed material in the sample area. More particularly, second ion beam 236 may remove material within a second portion 416 of semiconductor package 102.

In an embodiment, second ion gun 234 may be controlled to emit second ion beam 236 having a different spot size than first ion beam 232 emitted by first ion gun 230. For example, second ion beam 236 may be modulated to have a smaller spot size than first ion beam 232. By controlling spot size, the beams may be directed over smaller or larger areas of package substrate 106 to precisely control the trenching and cleaning operations.

It will be appreciated that, although first ion beam 232 and second ion beam 236 may be swept along window edge 406 to trench semiconductor package 102. In an alternative embodiment, ion beams 232, 236 are fixed within a frame of reference of sample preparation system 200 and semiconductor package 102 and mask 214 may instead by moved relative to the ion beams. Mask 214 may be mounted on semiconductor package 102 and the mask/package assembly may be moved in a linear fashion under ion beam sources 230, 234. The ion sources may be fixed, and thus, the beams are swept over window edge 406 linearly based on the relative movement between the moving mask/package assembly and the fixed ion beam source.

In an embodiment, removal of second portion 416 of semiconductor package 102 may expose the inside of semiconductor package 102 along first vertical plane 404. More particularly, second ion beam 236 may remove second portion 416 of semiconductor package 102 between second vertical plane 412 and first vertical plane 404. Removal of material between the laterally offset planes may widen the trench in semiconductor package 102 and remove material from the trench wall that includes artifacts caused by the higher current density beam. Accordingly, the trench wall may expose ROI 120 along first vertical plane 404, and ROI 120 may be artifact-free.

In an embodiment, first ion beam 232 and second ion beam 236 may be swept along window edge 406 sequentially. That is, first ion beam 232 having a higher current density may be swept along window edge 406, and after first ion beam 232 removes material within first portion 410 of semiconductor package 102, second ion beam 236 having a lower current density may be swept along window edge 406 to remove material within second portion 416 of semiconductor package 102.

When sweeping of first ion beam 232 and second ion beam 236 along window edge 406 is sequential, mask 214 may be shifted between the individual trenching operations to control a location of the trench wall. For example, during sweeping of first ion beam 232, mask 214 may be positioned such that window edge 406 is located within second vertical plane 412. First ion beam 232 may overlap mask 214, similar to the manner in which second ion beam 236 overlaps mask 214 (FIG. 4F). Mask 214 may nonetheless protect an underlying portion of semiconductor package 102 between first vertical plane 404 and second vertical plane 412. Thus, during the first trenching operation using first ion beam 232, the trench in semiconductor package 102 may be formed to have the trench wall along second vertical plane 412.

At optional operation 308, mask 214 may be moved to shift window edge 406 from second vertical plane 412 to first vertical plane 404 after sweeping first ion beam 232. More particularly, window edge 406 may be shifted in the direction of axis 220 from second vertical plane 412 to first vertical plane 404, i.e., to the location shown in FIG. 4F. Accordingly, a surface area of package substrate 106 above first portion 410 may be exposed to second ion beam 236. Second ion beam 236 may then be swept along window edge 406 to remove the material within second portion 416 between first vertical plane 404 and second vertical plane 412.

In an embodiment, first ion beam 232 and second ion beam 236 are swept simultaneously along window edge 406. More particularly, the sweeping operations 306, 308 may be performed simultaneously such that first ion beam 232 and second ion beam 236 traverse mask window 219 at the same time. Even when the ion beams are rastered simultaneously, second ion beam 236 may trail first ion beam 232 so that second portion 416 is removed after first portion 410 is removed. Beam edge 414 of first ion beam 232 may be laterally offset from window edge 406 at second vertical plane 412, and thus, first ion beam 232 may trench first portion 410 of package substrate 106 at the same time that second ion beam 236 trenches second portion 416 of package substrate 106.

Figure 4G:
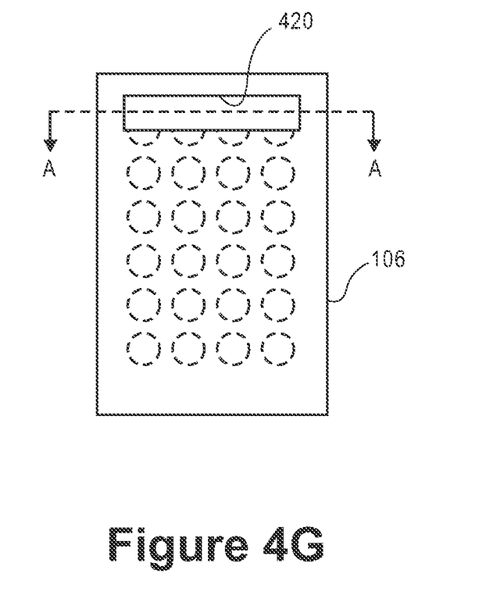
Figure 4H:
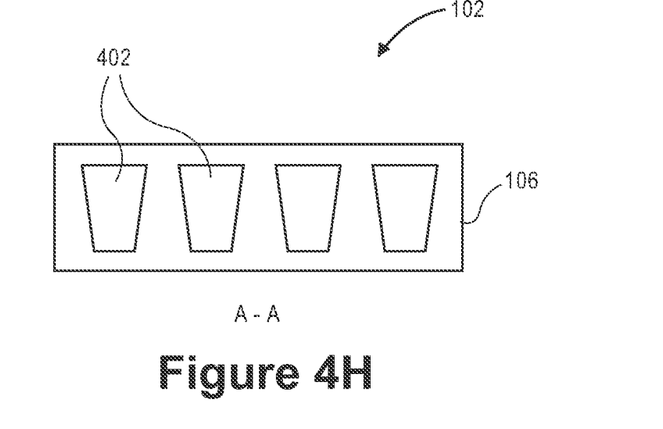

Referring to FIG. 4G, the accelerated ion beams may ablate material to remove first portion 410 and second portion 416 of semiconductor package 102 and to mill a package window 420. Package window 420 may extend through a portion or all of a thickness of semiconductor package 102. Package window 420 may have the predetermined geometry of mask window 219. For example, when mask window 219 has a rectangular profile, package window 420 may also have a rectangular profile. As described above, the edges of mask window 219 may include non-straight profiles, e.g., stepped, curved, etc. Accordingly, the edges and trench walls defining package window 420 may also include non-straight profiles. In an embodiment, package window 420 may have a window area that is less than a footprint of semiconductor package 102. More particularly, package window 420 may be surrounded by a remaining portion of semiconductor package 102. Accordingly, package window 420 may form a hole within semiconductor package 102, and the walls of the hole may have an artifact-free surface.

Referring to FIG. 4H, the trench in package substrate 106 may have a clean cross-sectional plane along ROI 120. ROI 120 can include an exposed surface of a buried feature. For example, ROI 120 may include an exposed surface of via 402. Via 402 may be buried within a wall of package substrate 106. Thus, ROI 120 may be visually inspected for failure analysis and to determine a root cause of a hidden failure in via 402, or another formerly buried feature that is exposed to view and artifact-free.

Throughout the description, first ion beam 232 and second ion beam 236 have consistently been referred to as independent beams generated by respective ion guns 230, 234. In an embodiment, however, a single ion beam is used to perform both trenching operations 306, 310. For example, a single ion gun may be configured to emit an ion beam having a range of beam densities and/or beam currents. That is, the single ion gun may be controlled to emit a first ion beam having a first ion beam density using first operating parameters, and then the single ion gun may be controlled to emit a second ion beam having a second ion beam density using second operating parameters. The single ion gun may be controlled to emit the first ion beam when the mask is aligned to vertical plane 412, i.e., to perform rough trenching of package substrate 106 at operation 306. The single ion gun may be controlled to emit the second ion beam when the mask is aligned to vertical plane 404, i.e., to perform cleaning of the roughly cut surface and to expose ROI 120 at operation 310.

Figure 5A:
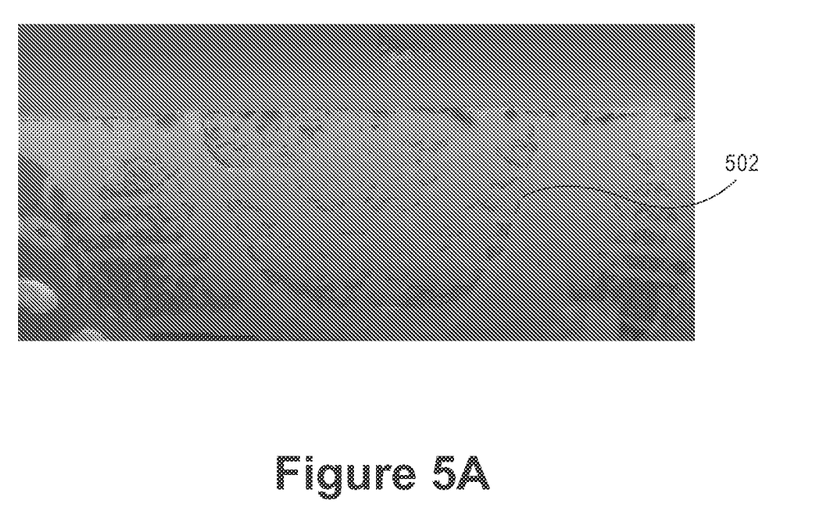
FIGS. 5A-5B are pictorial views of a region of interest of a semiconductor package at various stages of a method of sample preparation using dual ion beam trenching, in accordance with an embodiment.
Figure 5B:
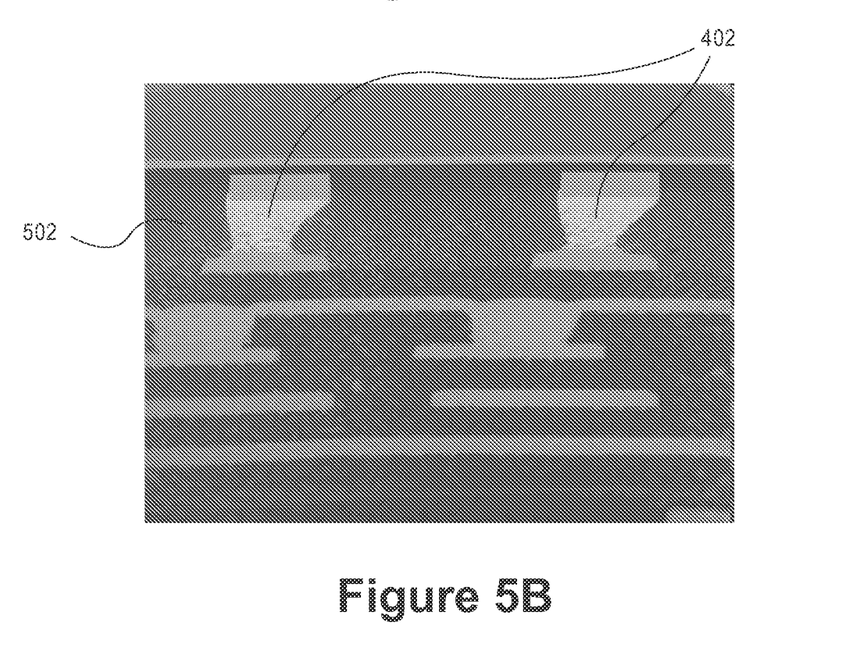

Referring to FIGS. 5A-5B, pictorial views of a region of interest of a semiconductor package at various stages of a method of sample preparation using dual ion beam trenching are shown in accordance with an embodiment. FIG. 5A shows a trench wall 502 extending along second vertical plane 412 after first ion beam 232 is swept across mask window 219 at operation 306. The image represents artifacts created by the high current density of first ion beam 232. More particularly, the high energy ablation by first ion beam 232 can smear material along trench wall 502. Accordingly, an underlying structure of package substrate 106 is obscured by the smeared material. FIG. 5B shows trench wall 502 extending along first vertical plane 404 after second ion beam 236 is swept across mask window 219 at operation 310. The exposed ROI 120 includes exposed surfaces of vias 402. The exposed surfaces of vias 402 are cleaned using the low current density ablation by second ion beam 236. That is, the smeared material is removed to expose an artifact-free underlying structure for inspection using microscopic techniques, e.g., visual microscopy or scanning electron microscopy.

Figure 6:
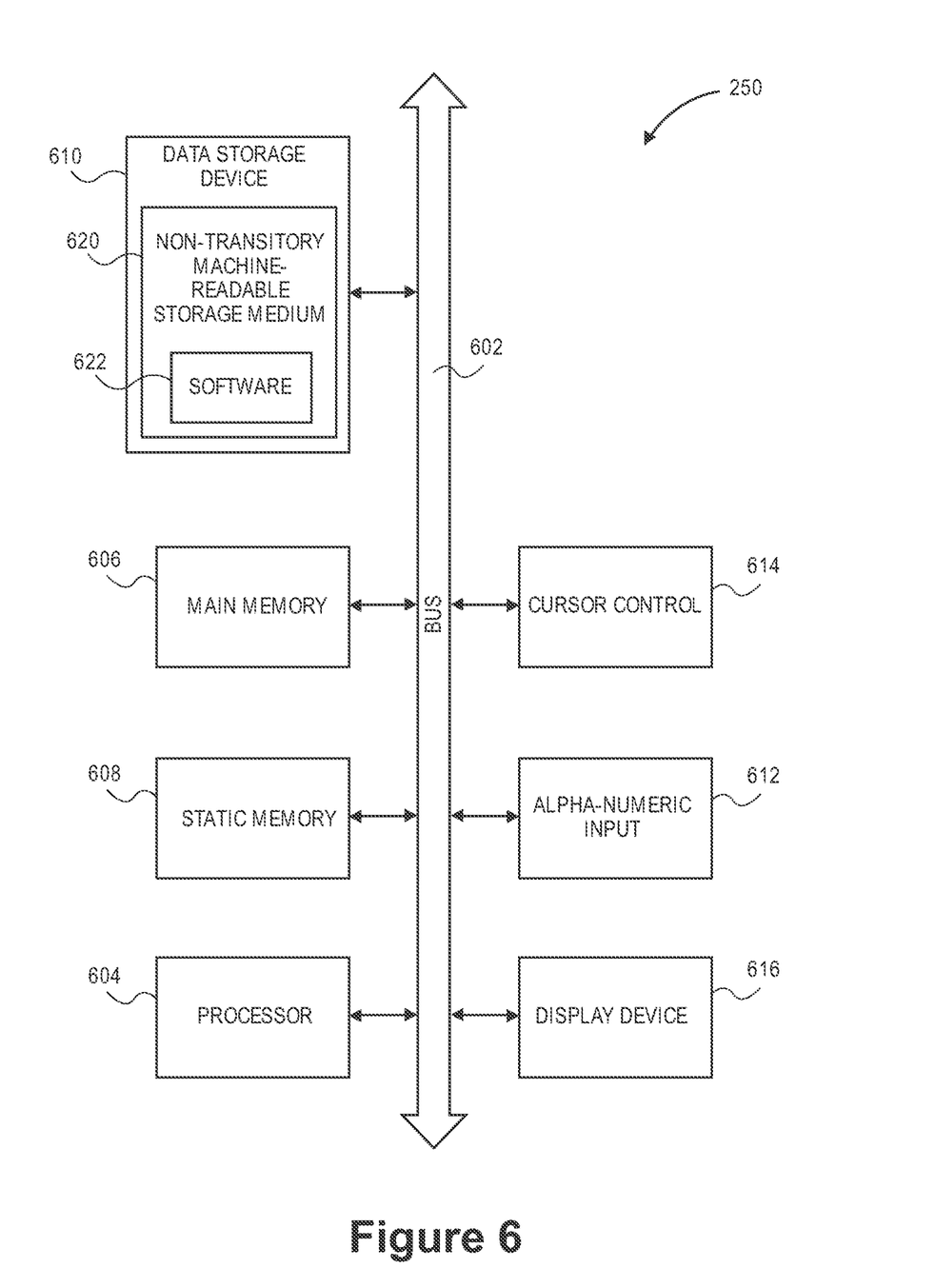
FIG. 6 is a schematic illustration of a computer system component of a sample preparation system, in accordance with an embodiment.

Referring to FIG. 6, a schematic illustration of a computer system component of a sample preparation system is shown in accordance with an embodiment of the invention. Portions of embodiments of the invention are comprised of or controlled by non-transitory machine-readable and machine-executable instructions which reside, for example, in machine-usable media of a computer system 250. Computer system 250 is exemplary, and embodiments of the invention may operate on or within, or be controlled by a number of different computer systems including general purpose networked computer systems, embedded computer systems, routers, switches, server devices, client devices, various intermediate devices/nodes, stand-alone computer systems, and the like. Computer system 250 may control the subsystems of sample preparation system 200 to perform the method operations described above.

Computer system 250 of FIG. 6 includes an address/data bus 602 for communicating information, and a processor 604 coupled to bus 602 for processing information and instructions. Computer system 250 also includes data storage features such as a computer usable volatile memory 606, e.g. random access memory (RAM), coupled to bus 602 for storing information and instructions for processor 604, computer usable non-volatile memory 608, e.g., read only memory (ROM), coupled to bus 602 for storing static information and instructions for the processor 604, and a data storage device 610 (e.g., a magnetic or optical disk and disk drive) coupled to bus 602 for storing information and instructions. Computer system 250 of the present embodiment also includes an optional alphanumeric input device 612 including alphanumeric and function keys coupled to bus 602 for communicating information and command selections to processor 604. Computer system 250 also optionally includes an optional cursor control device 614 coupled to bus 602 for communicating user input information and command selections to processor 604. Computer system 250 of the present embodiment also includes an optional display device 616 coupled to bus 602 for displaying information.

The data storage device 610 may include a non-transitory machine-readable storage medium 620 on which is stored one or more sets of instructions (e.g. software 622) embodying any one or more of the methodologies or operations described herein. Software 622 may also reside, completely or at least partially, within the volatile memory 606, non-volatile memory 608, and/or within processor 604 during execution thereof by the computer system 250, the volatile memory 606, non-volatile memory 608, and processor 604 also constituting non-transitory machine-readable storage media 620.

Figure 7:
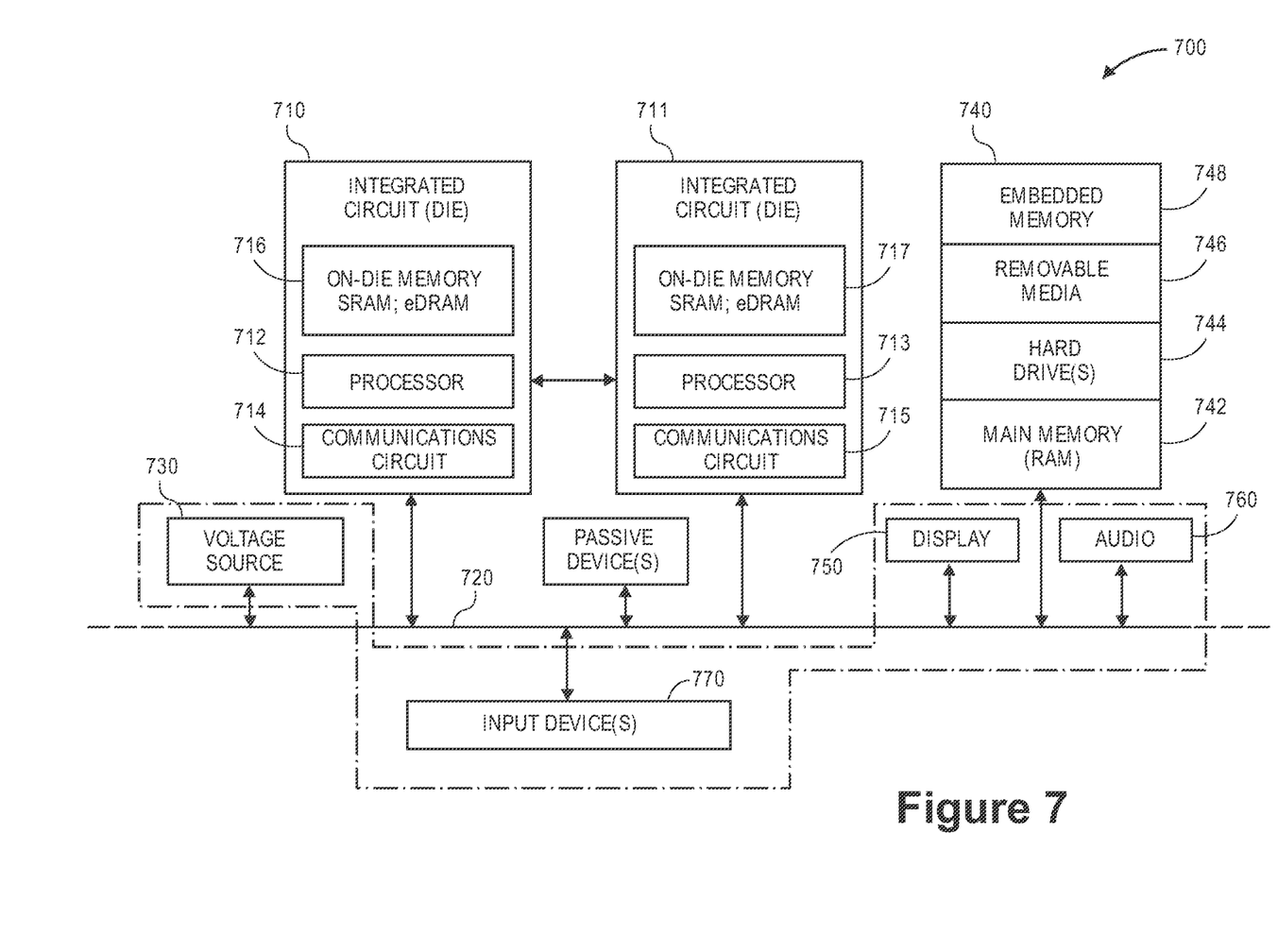
FIG. 7 is a schematic of a computer system, in accordance with an embodiment.

FIG. 7 is a schematic of a computer system, in accordance with an embodiment. The computer system 700 (also referred to as the electronic system 700) as depicted can embody a semiconductor package suitable for preparation and analysis as described according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, a semiconductor package suitable for preparation and analysis, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 711 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, and an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a semiconductor package suitable for preparation and analysis, according to any of the several disclosed embodiments and their equivalents, an electronic system, a computer system, one or more methods of fabricating an integrated circuit, and one or more methods of fabricating an electronic assembly that includes a semiconductor package suitable for preparation and analysis, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages suitable for preparation and analysis embodiments and their equivalents. A foundation substrate may be included, as represented by the dashed line of FIG. 7. Passive devices may also be included, as is also depicted in FIG. 7.

Embodiments of systems and methods of sample preparation using dual ion beam trenching are described above. In an embodiment, a method of sample preparation using dual ion beam trenching includes imaging an inside of a semiconductor package to determine a region of interest (ROI) along a first vertical plane. The method includes positioning a mask over the semiconductor package. The mask has a mask window defined in part by a window edge. The window edge is aligned with the ROI within the first vertical plane. The method includes sweeping a first ion beam having a first current density along the window edge to trench the semiconductor package. The method includes sweeping a second ion beam having a second current density along the window edge to trench the semiconductor package. The second current density is less than the first current density.

In one embodiment, the first ion beam removes a first portion of the semiconductor package to expose the inside of the semiconductor package along a second vertical plane. The second ion beam removes a second portion of the semiconductor package between the second vertical plane and the first vertical plane to expose the ROI.

In one embodiment, sweeping the first ion beam and sweeping the second ion beam is simultaneous.

In one embodiment, the first ion beam is swept over the first portion and has a beam edge at the second vertical plane. The beam edge is laterally offset from the window edge.

In one embodiment, sweeping the first ion beam and sweeping the second ion beam is sequential.

In one embodiment, the method includes moving the mask to shift the window edge from the second vertical plane to the first vertical plane after sweeping the first ion beam.

In one embodiment, imaging the inside of the semiconductor package is by an x-ray imaging system.

In one embodiment, the mask window has a predetermined geometry. Removing the first portion and removing the second portion forms a package window having the predetermined geometry in the semiconductor package.

In one embodiment, the first current density is at least an order of magnitude greater than the second current density.

In one embodiment, the first ion beam or the second ion beam are projected toward the mask window by an ion gun. Sweeping the first ion beam or sweeping the second ion beam includes rotating the ion gun about an axis orthogonal to the first vertical plane.

In an embodiment, a sample preparation system includes a sample stage having a support surface to hold a semiconductor package having a region of interest (ROI) along a vertical plane. The sample preparation system includes a mask having a mask window defined in part by a window edge. The window edge is aligned with the ROI within the vertical plane. The sample preparation system includes a first ion gun to project a first ion beam having a first current density. The first ion beam is movable along the window edge. The sample preparation system includes a second ion gun to project a second ion beam having a second current density. The second ion beam is movable along the window edge. The second current density is less than the first current density.

In one embodiment, the first ion beam and the second ion beam are movable simultaneously.

In one embodiment, the first ion beam and the second ion beam are movable sequentially.

In one embodiment, the first current density is at least an order of magnitude greater than the second current density.

In one embodiment, one or more of the first ion gun or the second ion gun are rotatable about an axis orthogonal to the vertical plane to sweep the first ion beam or the second ion beam along the window edge.

In one embodiment, the mask includes one or more of tungsten carbide or titanium.

In an embodiment, a sample preparation system includes a sample stage having a support surface to hold a semiconductor package having a region of interest (ROI) along a vertical plane. The sample preparation system includes an imaging system to image an inside of the semiconductor package to determine the ROI. The sample preparation system includes a first gun to project a first ion beam toward the semiconductor package. The sample preparation system includes a mask holder to position a mask between the semiconductor package and the first ion gun. The mask includes a mask window defined in part by a window edge. The sample preparation system includes a mask actuator operably coupled to the mask holder to align the window edge with the ROI within the vertical plane.

In one embodiment, the imaging system is an x-ray imaging system.

In one embodiment, the mask window has a predetermined geometry. The predetermined geometry is a closed figure.

In one embodiment, the first ion beam has a first current density. The sample preparation system includes a second ion gun to project a second ion beam having a second current density. The second current density is at least an order of magnitude less than the first current density.

The invention claimed is:

1. A method, comprising:
   imaging an inside of a semiconductor package to determine a region of interest (ROI) along a first vertical plane;
   positioning a mask over the semiconductor package, wherein the mask has a mask window defined in part by a window edge, and wherein the window edge is aligned with the ROI within the first vertical plane;
   sweeping a first ion beam having a first current density along the window edge to trench the semiconductor package, wherein the first ion beam removes a first portion of the semiconductor package to expose the inside of the semiconductor package along a second vertical plane; and
   sweeping a second ion beam having a second current density along the window edge to trench the semiconductor package, wherein the second current density is less than the first current density and wherein the second ion beam removes a second portion of the semiconductor package between the second vertical plane and the first vertical plane to expose the ROI.

2. The method of claim 1, wherein sweeping the first ion beam and sweeping the second ion beam is simultaneous.

3. The method of claim 1, wherein the first ion beam is swept over the first portion and has a beam edge at the second vertical plane, and wherein the beam edge is laterally offset from the window edge.

4. The method of claim 1, wherein sweeping the first ion beam and sweeping the second ion beam is sequential.

5. The method of claim 4 further comprising moving the mask to shift the window edge from the second vertical plane to the first vertical plane after sweeping the first ion beam.

6. The method of claim 1, wherein imaging the inside of the semiconductor package is by an x-ray imaging system.

7. The method of claim 1, wherein the mask window has a predetermined geometry, and wherein removing the first portion and removing the second portion forms a package window having the predetermined geometry in the semiconductor package.

8. The method of claim 1, wherein the first current density is at least an order of magnitude greater than the second current density.

9. The method of claim 1, wherein the first ion beam or the second ion beam are projected toward the mask window by an ion gun, and wherein sweeping the first ion beam or sweeping the second ion beam includes rotating the ion gun about an axis orthogonal to the first vertical plane.

\* \* \* \* \*